United States Patent [19]

Larson

[11] Patent Number: 5,365,465
[45] Date of Patent: Nov. 15, 1994

[54] FLOATING POINT TO LOGARITHM CONVERTER

[75] Inventor: Keith E. Larson, Stafford, Tex.

[73] Assignee: Texas Instruments Incorporated, Dallas, Tex.

[21] Appl. No.: 814,004

[22] Filed: Dec. 26, 1991

[51] Int. Cl.$^5$ .............................................. G06F 7/00
[52] U.S. Cl. .............................. 364/715.03; 364/748; 341/75; 341/106
[58] Field of Search ................ 364/715.03, 748.5; 341/50, 75, 106

[56] References Cited

U.S. PATENT DOCUMENTS

| | | |
|---|---|---|
| 4,583,180 | 4/1986 | Kmetz . |
| 4,626,825 | 12/1986 | Burleson et al. ............ 364/748.5 X |
| 4,682,302 | 7/1987 | Williams ............................ 364/768 |
| 4,720,809 | 1/1988 | Taylor . |
| 4,736,291 | 4/1988 | Jennings . |
| 4,777,613 | 10/1988 | Shahan et al. . |
| 4,858,163 | 8/1989 | Boreland . |
| 4,891,754 | 1/1990 | Boreland . |
| 5,197,024 | 3/1993 | Pickett ............................ 364/748.5 |

Primary Examiner—Tan V. Mai
Attorney, Agent, or Firm—Robert D. Marshall, Jr.; James C. Kesterson; Richard L. Donaldson

[57] ABSTRACT

A method converts an n-bit floating point number to a logarithmic representation, the number having a first set of bits assigned to a mantissa, and a second set of bits assigned to an exponent. The logarithmic representation has a characteristic and a fraction. The method: (a) sets the characteristic of the logarithm equal to the second set of bits; (b) selects from a logarithm table a first logarithm of a first subset of the first set; (c) selects from the logarithm table a slope of a logarithmic function at the first logarithm; (d) multiplies the slope times a second subset of the first set to obtain an interpolated value; (e) adds the interpolated value to the first logarithm to obtain the fraction; and (f) adds the characteristic and the fraction to obtain the logarithmic representation.

26 Claims, 10 Drawing Sheets

LOGARITHM

FLOATING POINT
REPRESENTATION

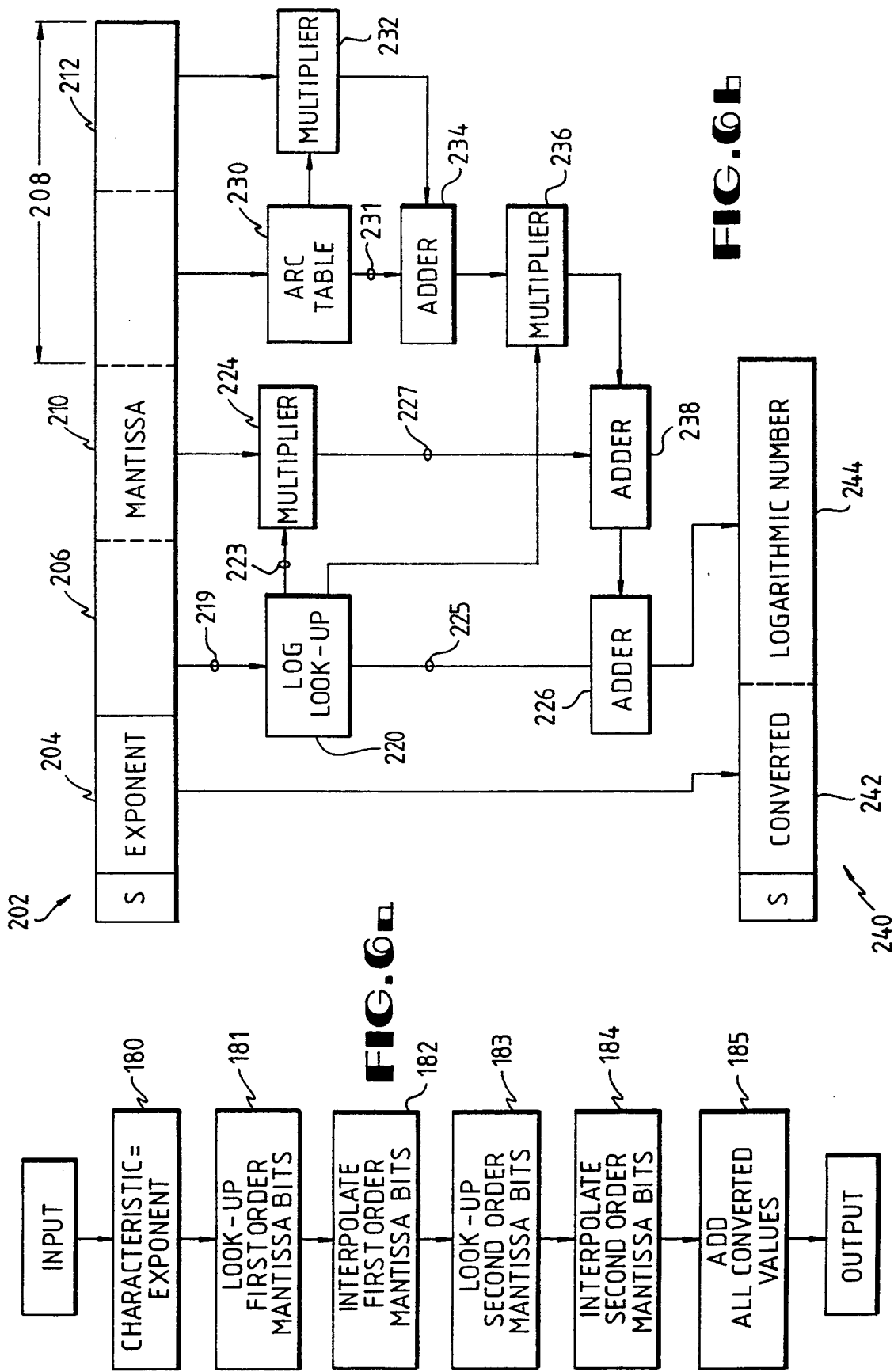

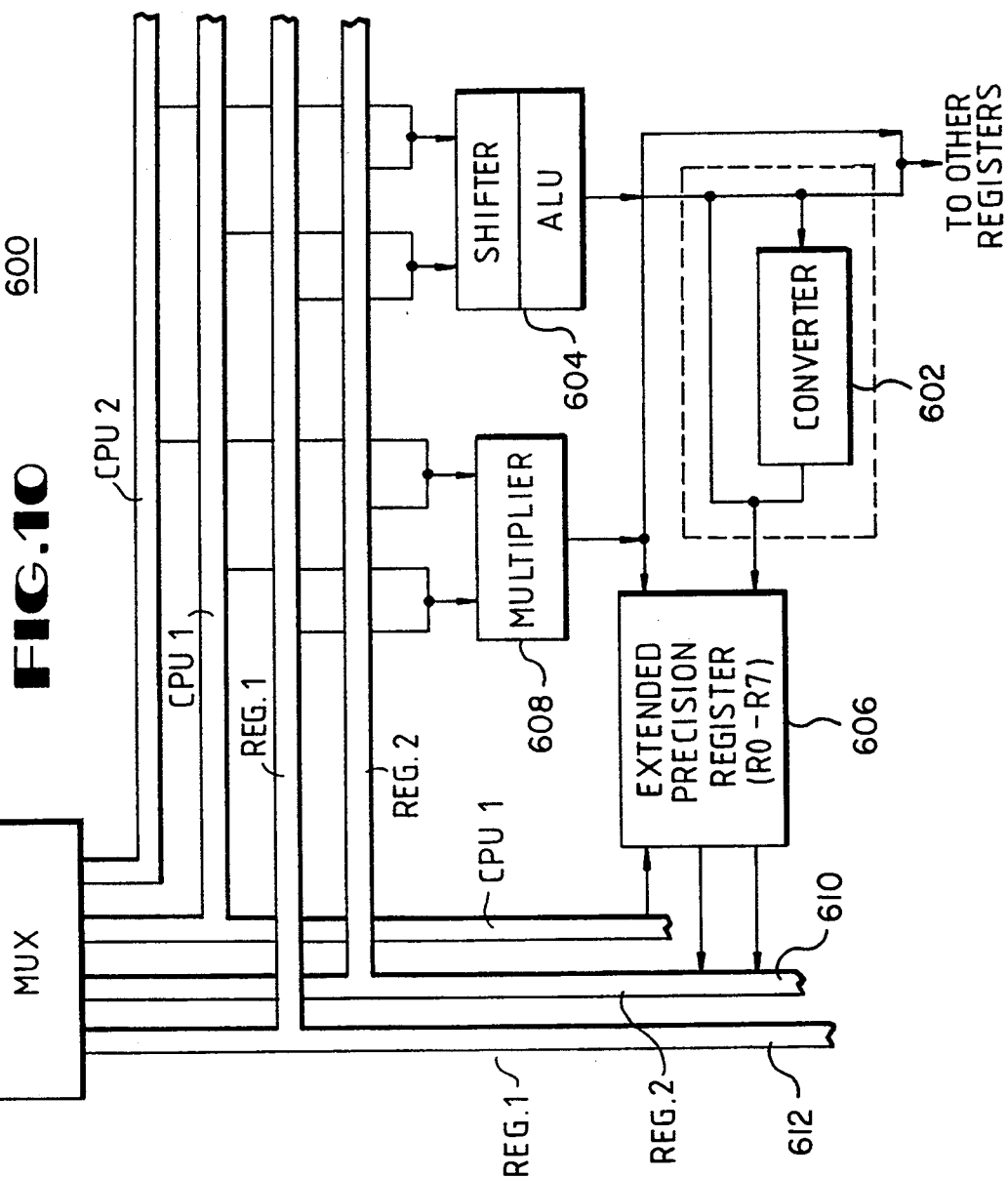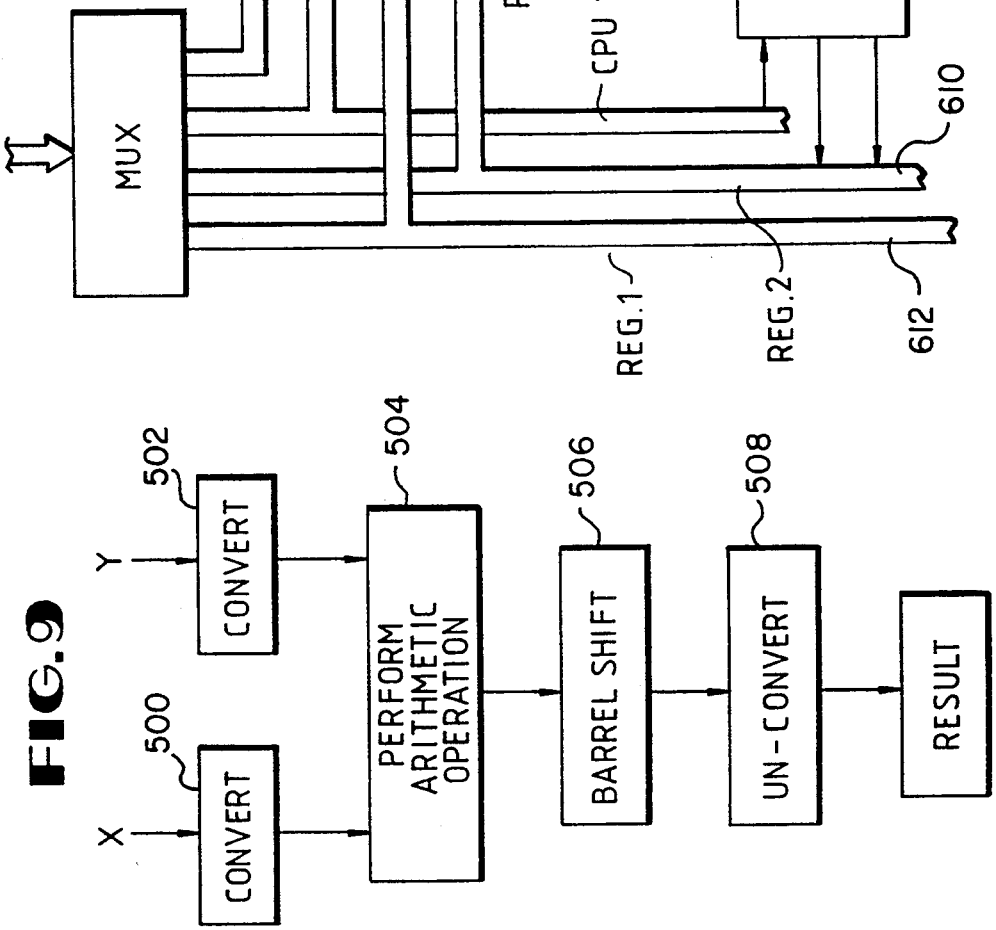

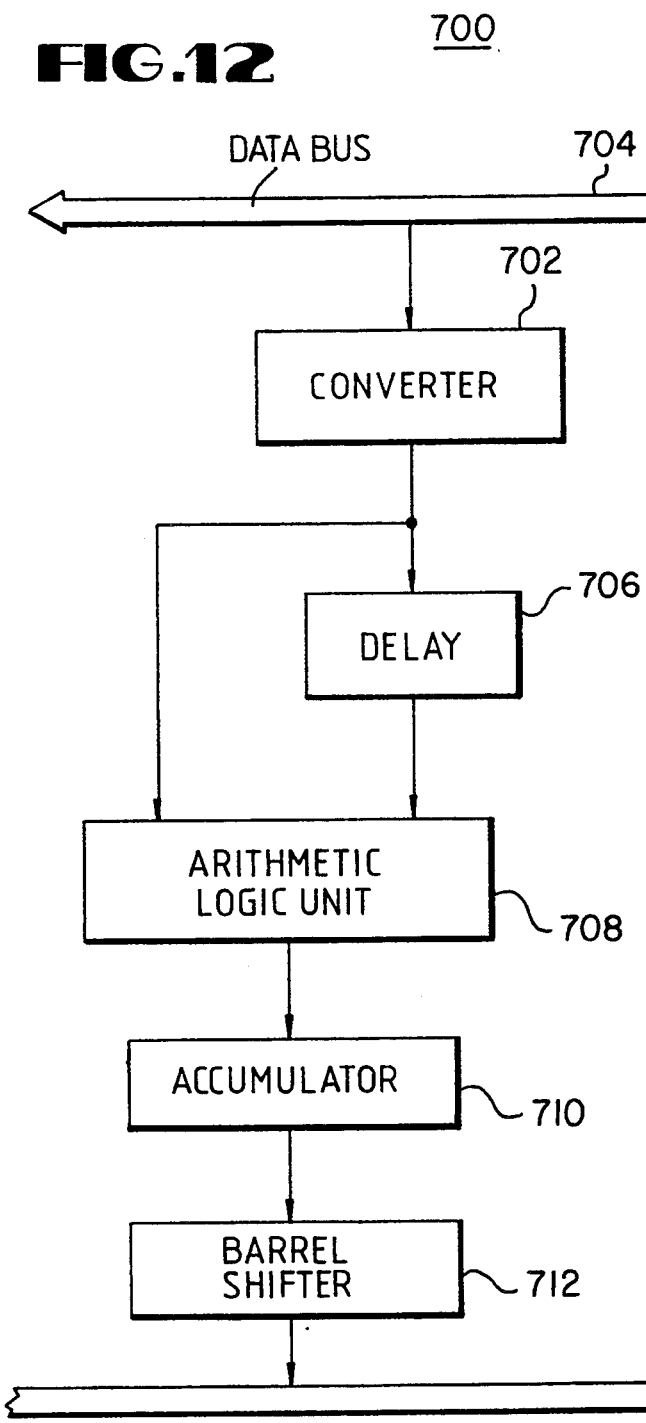

FLOATING POINT TO LOGARITHM CONVERTER

TECHNICAL FIELD OF THE INVENTION

This invention relates generally to the field of electronic calculating devices, and more particularly, to floating point arithmetic computing units.

BACKGROUND OF THE INVENTION

Arithmetic logic units (ALUs) are electronic components that are used to perform specific arithmetic and logic functions. In general, an ALU is considered a part of the central processing unit (CPU) of a general purpose computer or of a micro-processor. Recently, computer designers and manufacturers have begun utilizing ALUs that are incorporated in digital signal processors (DSPs) to meet the demands of special applications, such as pattern recognition, digital image enhancement, radar processing, speech filtering, etc. The architecture of DSPs is particularly well-suited for computing-intensive applications that require frequent high-speed arithmetic operations. More specifically, DSPs are high-speed reduced-instruction-set devices which are capable of carrying out limited tasks such as addition, subtraction, multiplication, and shifting operations faster than general purpose processors. A typical DSP includes a micro-instruction sequencer, read-only-memory (ROM), random-access-memory (RAM), a high-speed ALU, a parallel multiplier, and related storage registers. The DSP controls the operation of the ALU through the micro-instruction sequencer.

Although ALUs are capable of performing standard arithmetic operations (e.g., addition, subtraction, and multiplication) in a single computing cycle they are unable to perform, with accuracy, other floating point arithmetic operations in a single clock cycle. A floating point (FP) format allows numbers to be represented in a large dynamic range and with high precision, which are critical for many applications. Due to the limitations of current ALUs, for many applications requiring floating point arithmetic operations, the computing algorithms are often cumbersome and complex because the necessary floating point arithmetic functions must be derived from a lengthy sequence of supported floating point or non-floating point computations.

It would be advantageous for an ALU to be able to perform floating point calculations in a single clock cycle. Furthermore, it would be advantageous for an ALU to be implemented with a floating point architecture that would allow the ALU to perform more functions than are currently available in a typical ALU. The types of functions needed to be performed in a floating point ALU include floating point multiplication, division, square root, logarithms, exponents, and MacLauren series expansions. Finally, such an implementation of a floating point ALU should be consistent with the industry standard 32 bit IEEE floating point format.

The application of the logarithm number (LN) format to perform arithmetic functions is well known in the art. The FP is analogous to the LN. To illustrate, in a digital computer with a 32 bit/word binary format, an FP includes the sign bit and two other parts: the first or exponent part typically uses eight (8) bits and represents the power to which one raises the number two in order to get the approximate number. The dynamic range of numbers that can be represented thus extends from zero all the way through the number two raised to the 128th power. This first exponent part is then multiplied by a second or mantissa part, which typically has twenty-three (23) bits in order to fully define the number. The mantissa is normalized so that it always lies within a limited range of values with the highest value being twice the lowest value, in keeping with the doubling of the number upon each increment of the exponent part.

Similarly, in the LN of the same number, the logarithm exponent is divided into a portion to the left of the decimal point that comprises whole or integer numbers called the characteristic, and a portion to the right of the decimal point called the fraction. It is known in the art that, in a LN of base two, the characteristic is the same as the FP exponent, and the fraction is nearly the same as the FP mantissa, assuming that certain normalization ranges are used. In short, the major difference between the FP and the corresponding LN of the same number is that the FP uses only integer exponents and spans the numbers in between with a linear fractional multiplier, whereas the LN utilizes a continuous spectrum of exponents to represent the number. Thus, the LN exponent need not be multiplied by a fractional quantity in order to fully define the number.

The similarity between the FP and the LN has made it common for FP algorithms to use the exponent and mantissa of FPs as rough guesses for the corresponding characteristic and fraction of LNs. U.S. Pat. No. 4,583,180, issued to Kmetz, discloses a digital transformation system for converting between FP and LN of the same number by normalizing the FP in the range of one to two, and adapting one function as the other function, after a correction, wherein the correction is generated by a ROM using the one function as an address. However, because the transformation taught by Kmetz apparently only approximates arithmetic operations, the results are not as accurate as full floating point arithmetic operations. For the purpose of the Kmetz method, apparently accuracy is not essential because such transformation is used for speech recognition signal analysis in which the results of many multiplications are averaged together so that accuracy is not contingent upon any one multiplication.

U.S. Pat. No. 4,720,809, issued to Taylor, discloses a hybrid FP/LN arithmetic processor. The patent discloses a hybrid arithmetic processor which combines attributes of conventional FP arithmetic with LN arithmetic. The arithmetic processor includes an input section for converting FP input operands to LN intermediate operands. A computing section performs arithmetic operations on the LN intermediate operands. An output section converts the LN intermediate output of the computing section to FP.

Taylor further discloses full look-up tables for converting from FP to LN. The look-up tables, as implemented in ROM, apparently require that the number of address lines be equal to the bit width of the input FP mantissa and the word length be equal to the bit width of the corresponding LN fraction. The Taylor method apparently requires a full mapping technique for converting from FP to LN. The full mapping technique requires a high utilization of ROM resources and is difficult to implement for a floating point format of 32-bit width, e.g., the IEEE floating point format.

Thus, there is a need in the art for improved speed and accuracy in performing floating point arithmetic operations.

SUMMARY OF THE INVENTION

The invention overcomes the above-noted and other deficiencies of the prior art by providing a method and apparatus for accurately converting FP to LN, performing arithmetic functions in LN, and accurately converting the result back to FP. The invention features the capability of performing floating point arithmetic functions in a single clock cycle with a high degree of accuracy for addition, subtraction, multiplication, division, and square roots, wherein any one of such arithmetic functions is performed in a single clock cycle.

The present invention allows look-up tables in existing ALU designs to remain constant and causes no increased in the ROM size, while increasing the ALU performance in floating point arithmetic operations. Moreover, because the look-up tables are constant, the ROM size can be further decreased by about 30%, using existing optimization techniques that reduces the table size on the basis of the bit pattern. In short, the new ALU has significantly greater accuracy and is comparable in size to the existing ALU architecture.

The present invention comprises an ALU with a floating point architecture. A base two logarithm method is implemented for converting FP to LN. The conversion is implemented through a transformation process involving the use of look-up tables and an interpolation method. This transformation process can quickly convert a number from its FP to its LN and vice versa. After the number is converted, the desired arithmetic functions are performed in the logarithmic domain. After arithmetic functions are performed, the LN is converted back to FP.

BRIEF DESCRIPTION OF THE DRAWINGS

The above-noted and other aspects of the present invention will become more apparent from a description of the preferred embodiment when read in conjunction with the accompanying drawings.

The drawings illustrate the preferred embodiment of the invention. In the drawing the same members have the same reference numerals.

FIG. 6(a) is a flow chart of a second-order interpolation according to the method of the present invention.

FIG. 6(b) is a block diagram of a second-order converter built according to the present invention.

FIG. 9 is a block diagram of a floating point ALU, built according to the preferred embodiment of the present invention.

FIG. 10 and 11 are block diagrams of DSPs having converters built according to the present invention.

FIG. 12 is a block diagram of a DSP with pipeline architecture having a converter built according to the present invention.

DETAILED DESCRIPTION OF THE INVENTION

Figure 1A:
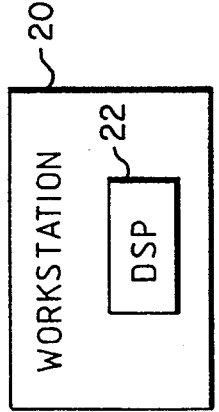
FIG. 1(a)-1(c) are block diagram depicting a high speed digital computation system containing a converter built according to the present invention.
Figure 1B:
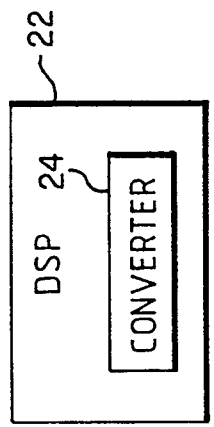
Figure 1C:
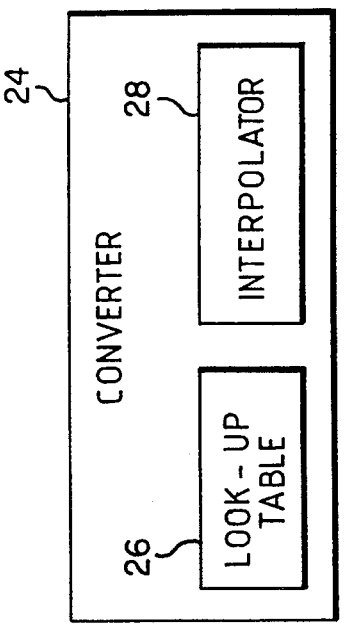

The preferred embodiment of the invention is illustrated in FIGS. 1(a)-1(c) FIG. 1(a) depicts a computer workstation 20 or any high-speed digital computation system with a DSP 22, or comparable arithmetic computing device. FIG. 1(b) depicts the DSP 22 with a converter 24, built according to the present invention. FIG. 1(c) depicts the converter 24 having a look-up table 26 and an interpolator 28.

Figure 2A:
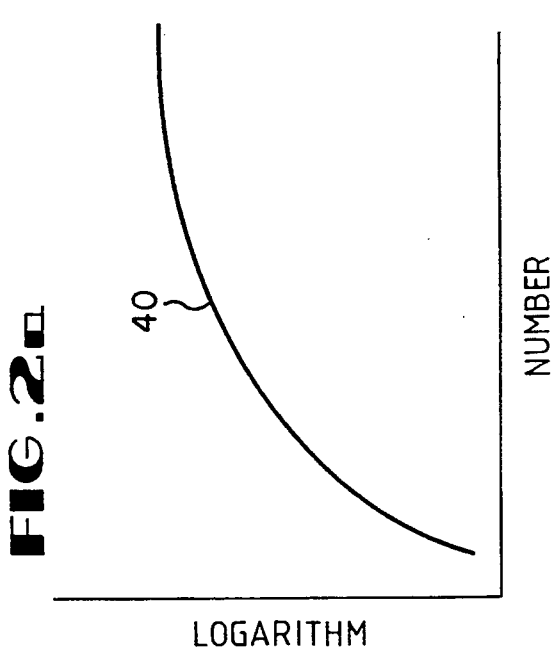
FIGS. 2(a)-2(b) and 3 illustrate the relationship between FP and LN, specifically, between the FP mantissa and LN.
Figure 2B:
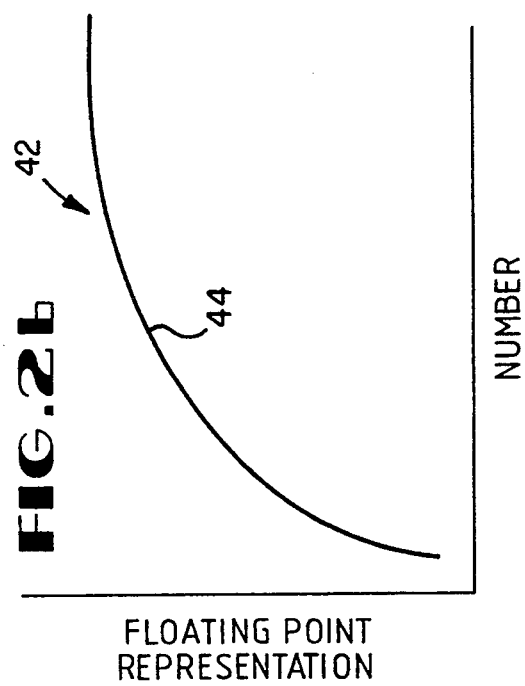

FIG. 2(a) illustrates that as a number increases, its corresponding logarithmic value increases along a smooth curve 40, although at a progressively lesser rate of increase. Likewise, referring to FIG. 2(b), the FP of a number follows a similar curve 42, in which a series of straight line segments 44 make up a curve because the numbers between the exponent are represented with a linear fractional multiplier, i.e., the mantissa.

Figure 3:
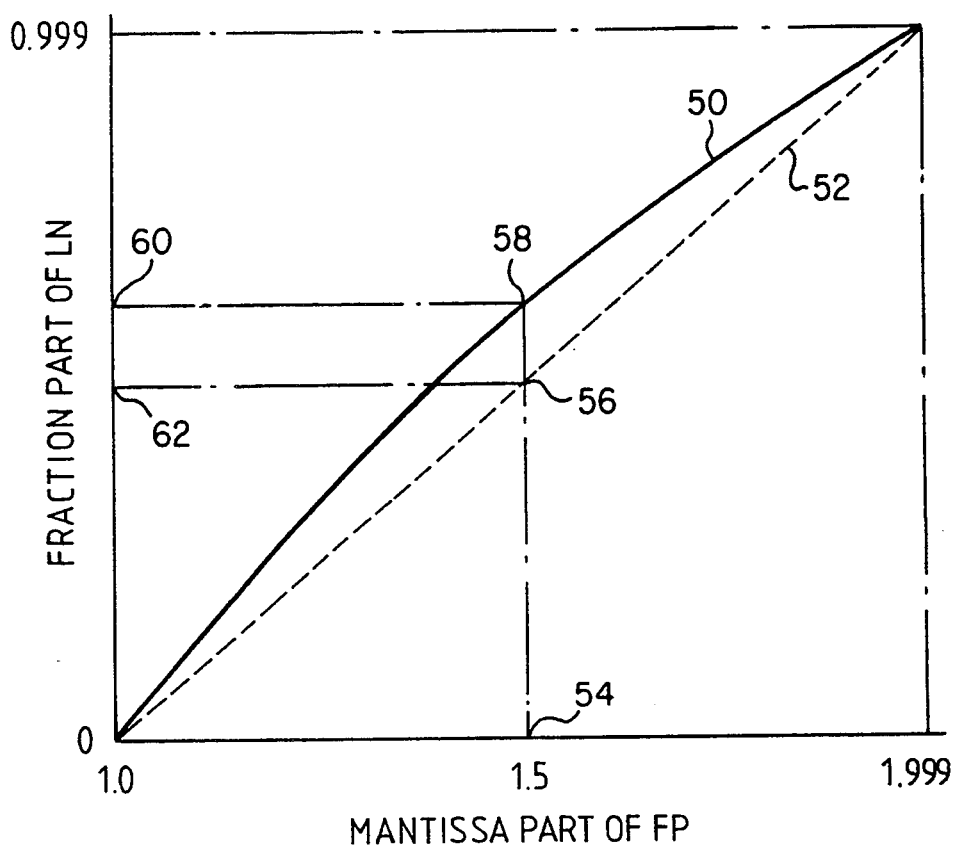

FIG. 3 depicts a close correlation between the mantissa of a FP and the corresponding LN fraction. In FIG. 3, the x-axis is the normalized range of the mantissa bounded between 1.0 and 1.999. The y-axis is the logarithmic fraction bounded between 0.0 and 0.999. Curve line 50 is the exact LN function which maps the FP mantissa to the corresponding LN fraction. Dashed line 52 illustrates that the FP mantissa, as it increases from 1.0 to 1.999, relates closely to its corresponding LN fraction. It is observed that given a mantissa, line 52 approximately maps the exact corresponding fraction.

Another approach for illustrating the relationship between the floating point representation of a number and the corresponding logarithmic representation is by observing the following equations:

$$\text{FP number} = \text{mantissa} * 2^{\text{exponent}} \quad (1)$$

$$\text{exponent} = \log_2(\text{FP}/\text{mantissa}) \quad (2)$$

$$\text{exponent} = \log_2(\text{FP}) - \log_2(\text{mantissa}) \quad (3)$$

$$\log_2(\text{FP number}) = \text{exponent} + \log_2(\text{mantissa}) \quad (4)$$

In equation (1), a number is represented in FP as the value of the FP mantissa of that number multiplied by 2 raised to the exponent of that number. In equation (2), the inverse function for the exponent is the logarithm in base two of the quotient of the FP divided by the mantissa, and the mantissa is bounded by 1.0 and 1.999 in order to cover the range of one least significant bit (LSB) change in the exponent. Equation (2) can also be expressed in the form of equation (3) and equation (4). Thus, it is clear, as shown in equation (4), that the logarithmic representation in base two of a floating point number can be expressed as the exponent plus the logarithmic value of the mantissa.

Because the mantissa is always bounded between the values of 1.0 and 1.999, the value of 1, the integer part of the mantissa, need not be represented in the FP format. Therefore, the value of 1 is treated as an implied constant and does not appear in the bit field of the FP representation of a number. This treatment of the mantissa representation conserves space and improves the efficiency of ALU units.

Furthermore, since the FP mantissa is always represented in the range of 0.0 to 0.999, it is observed that the mantissa closely approximates the LN fraction, which also spans the range of 0.0 to 0.999.

Referring again to FIG. 3, as stated earlier, an FP mantissa closely approximates the LN fraction of the same number. In order to compute the LN fraction, given the FP mantissa, an adjustment (an error factor) must be added to the mantissa. For example, given an FP mantissa of value 1.5 54, the exact corresponding LN fraction, $Y_{true}$ 60 on line 50, is slightly higher then the corresponding mapped value, $Y_{est}$ 62 on line 52. Therefore, to obtain the LN fraction, a error factor, $E_x$, the difference between 56 and 58, must be added to the mantissa in order to arrive at the logarithmic fraction.

In general, to determine the error factor $E_x$ between line 50 and line 52 of FIG. 3, it is first observed that the end points of lines 50 and line 52 are the same, and the maximum value of $E_x$ is relatively small. Due to the nearly one-to-one relationship and the low curvature between line 50 and line 52, the invention uses a look-up table and a linear interpolator to transform an FP mantissa to its corresponding LN fraction. It is recognized that a look-up table incorporating all points on line 52, i.e., mapping all mantissa values to the desired precision, is impractical. This invention uses a linear interpolation method, which reduces the size of the look-up address by one-half, which results in the reduction of a fully mapped look-up table by a factor of a square root of the size of the table.

Figure 4B:
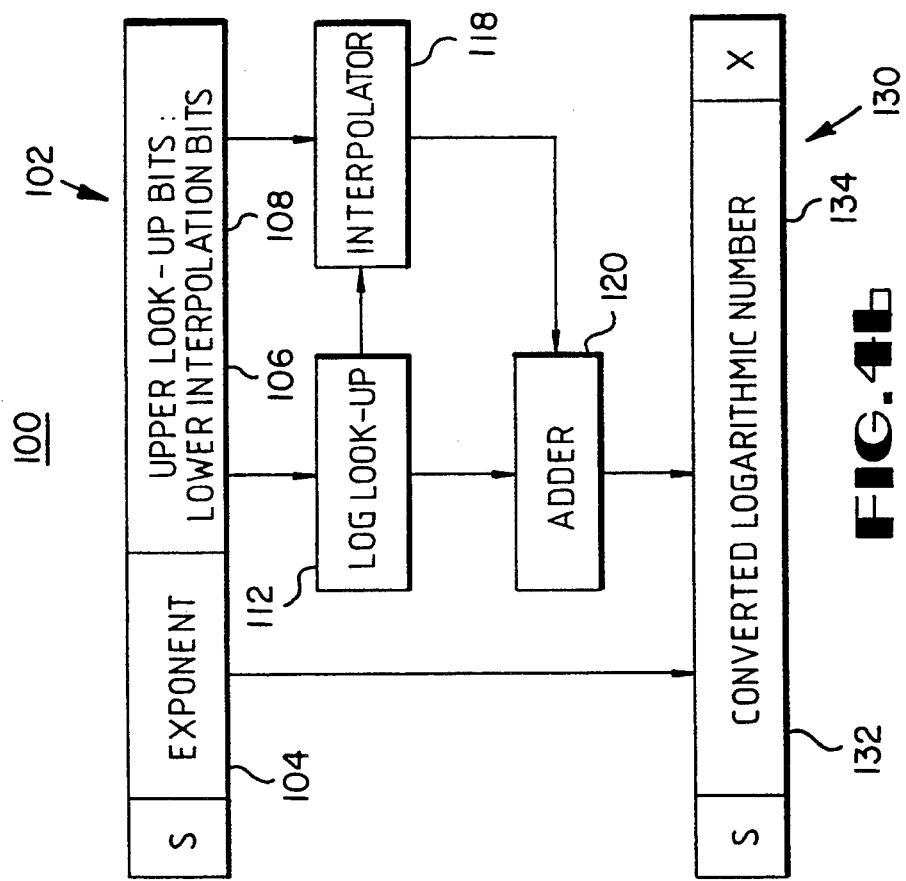
FIG. 4(b) is a block diagram of a first-order converter built according to the present invention.
Figure 4A:
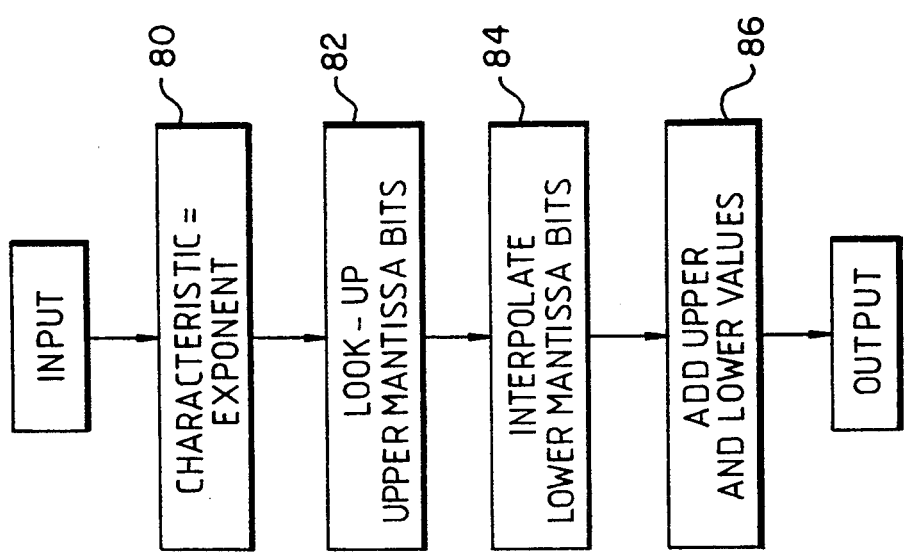
FIG. 4(a) is a flow chart of a first-order interpolation according to the method of the present invention.

FIG. 4(a) is a flow chart depicting the FP to LN conversion method of the preferred embodiment of the invention. In step 80, the exponent of the input FP operand is used as the characteristic of the converted LN value. In step 82, the upper order bits of the FP mantissa are used as an address into a look-up table. The address in the look-up table contains the exact LN value corresponding to the address. In step 84, the lower order bits of the FP mantissa are interpolated to compute its corresponding LN value. In step 86, the LN values of the upper and lower order bits of the mantissa are added to determine the LN fraction. This conversion method is comprised of a straight line interpolation of LN values spanning two look-up addresses as represented by the well-recognized line equation of $y = mx + b$.

FIG. 4(b) is a block diagram which illustrates the FP to a LN converter 100 of the preferred embodiment of the invention. A register 102 containing a floating point number in the IEEE format is represented as an exponent 104 concatenated with the fractional part of the mantissa, comprised of upper order look-up bits 106 and lower order interpolation bits 108. The conversion of a number in the floating point representation to its corresponding logarithmic representation begins by equating the FP exponent 104 as the value representing the LN characteristic 132 of the LN value stored in register 130. This is possible because an FP exponent corresponds exactly to an LN characteristic.

Next, the fractional part of the logarithm, or LN fraction 134, is computed by the use of a look-up table 112 and an interpolator 118. The look-up table 112 is connected to the upper look-up bits 106. The look-up table is also connected to the interpolator 118 and an adder 120. The upper look-up bits 106 are used as an input address to the look-up table. The address in the look-up table 112 contains a value called SEED, which is the exact LN fraction for the value represented by the upper look-up bits of the mantissa. The look-up table also has a value of SLOPE, which is the rate of change between two adjacent SEEDs, for every address. Given an input address from the upper look-up bits, the look-up table outputs the SEED to the adder 120 and also outputs the SLOPE to the input of the interpolator 118.

The interpolator 118 is connected to the lower order bits of the mantissa, or the lower interpolation bits 108. The interpolator is also connected to the look-up table and the adder. The value of the lower interpolation bits is input into the interpolator and multiplied with the value of SLOPE from the look-up table to compute the interpolated LN fraction corresponding the value of mantissa as represented by the lower interpolation bits. The resulting LN value is combined with the SEED value by the adder 120 and becomes the LN fraction 134.

To summarize, in order to perform the conversion of an FP mantissa to the corresponding LN fraction, the upper look-up bits of the mantissa are used as an address into the look-up table. In the look-up table, each address is mapped to a corresponding SEED value which is the exact value of the logarithmic fraction for the high bits value of the mantissa. Additionally, the address maps to a SLOPE value, which is pre-determined by computing the difference between the current SEED and the previous SEED. Second, a interpolator computes the LN value corresponding to the low order bits of the mantissa using a multiplier. The multiplier multiplies the low order bits by the SLOPE in order to interpolate the lower value of the logarithmic fraction. Finally, the SEED and the interpolated value are combined in an adder to form an LN fraction of a given FP number.

The size of the look-up table 112 is dependent on the method of interpolation used and the bit length of the FP format to be converted. In the preferred embodiment, a first and second order linear interpolation methods are used for efficiency and accuracy. The FP format is the IEEE format, having a bit length of 32 bits, comprising a sign bit, a 8 bit exponent, and a 23 bit-width mantissa with 11 bits representing the upper look-up address and 12 bits representing the lower interpolation value. In the first order linear interpolation, a converter configured with a look-up table having an 11 bit address combined with an interpolation of a 12 bit value will provide sufficient accuracy for the IEEE FP format.

The accuracy of this configuration is shown as follows. Equation (5) below is disclosed for calculating the table size on the basis of the bits of accuracy desired. For linear interpolation with the requirement that the output of the ALU be accurate to 1 LSB, it is required that the curvature height between the SEEDs must be less than 1LSB of the desired accuracy. The relationship between an interpolated value and the exact LN value is as follows:

$$\text{EXACT} = \text{SEED} + (\text{SLOPE} * \text{INTERP}) + \text{ERR} \quad (5)$$

where,

EXACT is the desired logarithmic fraction;

ERR is the interpolation error between the straight line interpolation and the actual logarithmic function;

SEED is the LN value corresponding to the nearest look-up address;

SLOPE is the difference between the one SEED value and the next adjacent SEED value; and INTERP is the step size or address of the desired interpolation value between two SEED values.

Figure 5:
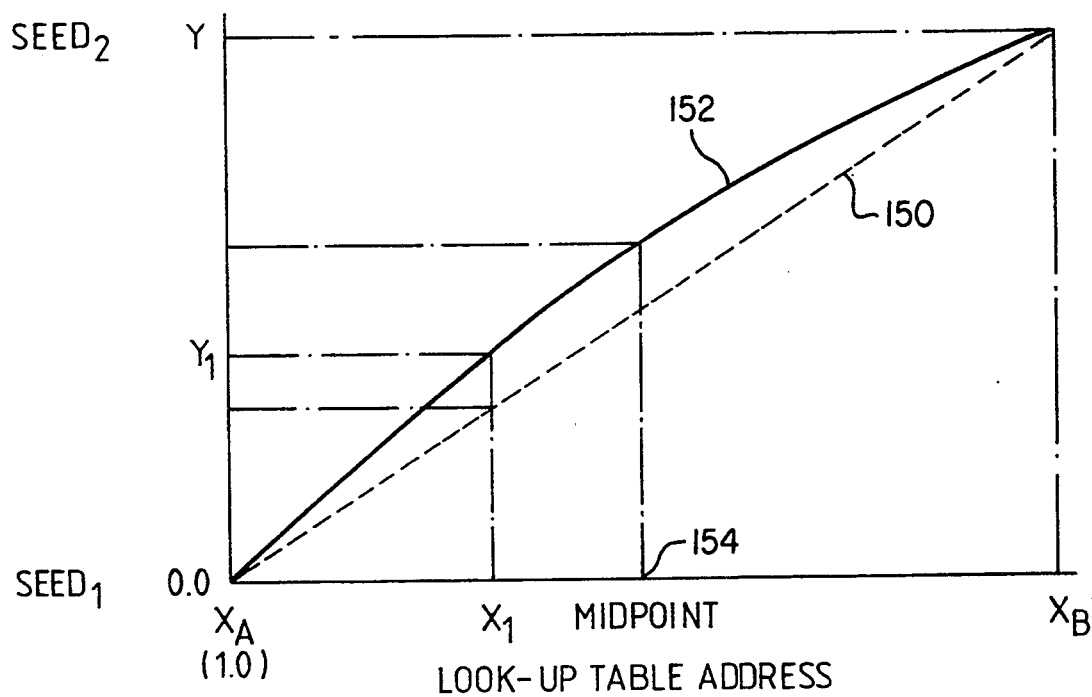
FIG. 5 illustrates interpolation and margin of error between two logarithmic look-up values.

Referring to FIG. 5, the point of maximum error, ERR$_{max}$, is the point at which the deviation of a true logarithmic function 152 from a straight line approximation 150 is at its greatest. By differentiating the logarithm twice, to determine the rate of change of the curvature of the logarithmic function, the maximum curvature is found to occur at a mantissa value of one (1.0), where the SEED value is zero (0), which represents the logarithm of one. Furthermore, as the number of SEEDs increases due to the increase of the look-up table size, the change in curvature between two adjacent SEEDs becomes small.

FIG. 5 illustrates that the interpolation error value is the difference between the true logarithmic function 152 and the interpolated line 150. Moreover, the point of maximum deviation from the straight line interpolation to the logarithmic function converges to the midpoint of the two lines, which represents the maximum error between any two SEED values. For any adjacent address of the look-up table, a maximum error can be calculated as the difference between the exact LN value and the interpolated value at the midpoint between two adjacent look-up addresses.

As stated earlier, the maximum curvature of the logarithmic function occurs at a mantissa value of 1.0, where the SEED value is 0. Therefore, given a look-up address, ADDR1, that represents a mantissa value of 1.0 with a SEED value of 0, an adjacent address, ADDR2, is selected. The selection of this address pair makes it simpler to calculate the maximum error associated with the various configurations of look-up addresses to interpolation values. The computation is as follows:

ADDR1 and ADDR2 correspond to SEED1 and SEED

Therefore,

SEED1 = log2(mantissa value of ADDR1)

SEED2 = log2(mantissa value of ADDR2)

Since mantissa value of ADDR1 is 1.0, then
SEED1 = log2(1.0) = 0.0

The SLOPE between ADDR1 and ADDR2 is

SLOPE = SEED2 − SEED1

Since SEED1 = 0, then

SLOPE = SEED2

As stated earlier, the maximum error occurs at the midpoint of the lines; thus the interpolation address at with the maximum error occurs is at 0.5, which represents the midpoint of 0.0 and 0.999. The maximum error is computed as follows:

As stated earlier in equation (5),

EXACT = SEED + (SLOPE*INTERP) + ERR or

ERR = EXACT − SEED − (SLOPE*INTERP)

Using the ADDR1 and ADDR2 address pair described earlier, let

SEED = SEED1 = 0
SLOPE = SLOPE of ADDR1 and ADDR2 = SEED2
INTERP = 0.5 then

ERR = EXACT − (SEED2*0.5)

Therefore, the error at the midpoint of two look-up addresses is the maximum error for a particular look-up/interpolate configuration. By calculating the LN value of the value of EXACT at the midpoint of two addresses, the maximum error for that particular address pair is determined. Furthermore, by evaluating all adjacent address pairs over the entire range of N look-up addresses, the maximum error of a given look-up table size is determined. A table of maximum error for the corresponding look-up/interpolation configuration is presented below:

TABLE 1

| Look-up bit size | Interpolate bit size | Maximum error | Bits of accuracy |
| --- | --- | --- | --- |
| 1 | 5 | 2.945e-02 | 5.09 |
| 2 | 5 | 8.961e-03 | 6.80 |
| 3 | 6 | 2.500e-03 | 8.64 |
| 4 | 7 | 6.627e-04 | 10.56 |
| 5 | 8 | 1.708e-04 | 12.52 |
| 6 | 9 | 4.335e-05 | 14.49 |
| 7 | 10 | 1.092e-05 | 16.48 |
| 8 | 11 | 2.741e-06 | 18.48 |
| 9 | 12 | 6.866e-07 | 20.47 |
| 10 | 13 | 1.718e-07 | 22.47 |
| 11 | 14 | 4.297e-08 | 24.47 |
| 12 | 15 | 1.075e-08 | 26.47 |
| 13 | 16 | 2.687e-09 | 28.47 |
| 14 | 17 | 6.718e-10 | 30.47 |
| 15 | 18 | 1.679e-10 | 32.47 |
| 16 | 19 | 4.199e-11 | 34.47 |

From this table, an 11 bit look-up table address is illustrated to have an accuracy in excess of 24 bits which is sufficiently accurate for converting the 23 fractional mantissa bits of a 32 bit floating point number. By determining the maximum errors, the look-up table conversion shows that for any mantissa length, the look-up table address (and interpolation size) is about one-half of the desired bits of accuracy. From this it can be concluded that for less accurate mantissa conversions, this technique becomes exceedingly efficient.

In order to improve the precision of the conversion, a second order interpolation method and apparatus are provided in which a secondary set of look-up table and interpolator is used to effectively double the accuracy of the first order interpolation. Furthermore, this interpolation method will quadruple the accuracy of a conversion method using a fully mapped ROM look-up table. Additionally, a second order interpolation method will reduce the look-up table size to one quarter of the size needed for a first order interpolation look-up table implementation.

FIG. 6(a) is a flow chart depicting an FP to LN conversion using a second order interpolation method of the preferred embodiment of the invention. In step 180, an exponent of the input FP operand is used as the characteristic of the output LN value. The FP mantissa is divided into four parts: first order look-up bits, bits 16–22, second order look-up bits, bits 9–15, first order interpolation bits, bits 0–15, and second order interpolation bits, bits 0–8. In step 181, the first order look-up bits are used as an address into a first order look-up table. The address in the look-up table contains the exact LN value corresponding to the address. In step 182, the first order interpolation bits, bits 0–15, are multiplied times the slope, that is, interpolated linearly, to compute the corresponding LN value. In step 183, the second order look-up bits are used as an address into a second order look-up table. In step 184, the output from the second order look-up table is a SEED 231. The SEED 231 is added to an interpolated value derived the second order interpolation bits to better interpolate the true logarithmic function and achieve greater accuracy. In step 185, the LN values from all the above steps are added to determine the resulting LN fraction value.

FIG. 6(b) is a block diagram of the second order FP to LN converter 200 of the preferred embodiment of the invention. A register 202 contains an IEEE format 32 bit FP number representation. The FP number is represented by a sign bit, a 8 bit exponent, and a 23 bit mantissa. The FP exponent 204 connects to the LN characteristic 242 and is used as the value of the characteristic of the converted LN. The FP mantissa is divided into four parts: first order look-up bits 206, bits 16–22, first order interpolation bits 208, bits 0–15, second order look-up bits 210, bits 9–15, and second order interpolation bits 212, bits 0–8.

A first order look-up table 220 receives the first order look-up bits 206 and generates a first logarithm 225. The table 220 also generates a slope 223. The first order look-up bits are used as an address in the look-up table. For each address, there is a SEED value representing the exact LN fraction for the first order look-up bits. There is also a SLOPE value 223 for each address that represents the rate of change between two adjacent SEEDs. There is also a CURVATURE value that represents the rate of change between two adjacent SLOPE values. Given an address as represented by the first order look-up bits 206, the look-up table 220 outputs the SEED to an adder 226. The look-up table outputs the SLOPE to the first order interpolator 224. The look-up table outputs the CURVATURE to a multiplier 236. The slope 223 is multiplied times the first order interpolation bits in the multiplier 224, to generate a first order linear interpolation 227 between the two adjacent look-up values. To increase accuracy over the first order interpolation method, the difference between the straight line interpolation function and the true logarithmic function must be computed in order to produce a more accurate resulting logarithmic value. Therefore, a second order look-up table 230 (labeled "ARC" in FIG. 6b) and a second order interpolator 232 are used to increase the accuracy for determining the interpolation between two adjacent look-up values.

The first order interpolator 224 is connected to the first order interpolator bits 208. The value of the interpolator bits is multiplied with the SLOPE value from the first order look-up table 220 to compute a result that represents the first order linear interpolation of the corresponding LN fraction value. The output of the interpolator is connected to an adder 238.

To achieve additional accuracy from the first order interpolation, a second order look-up table 230 is connected to the second order look-up bits 210. The second order look-up bits are used as an address in the second order look-up table. For each address, there is a corresponding SEED', a second order SEED value, representing a point on an arc spanning between two SEED values, i.e., two first order look-up values. The arc is a small section of the logarithmic function as illustrated by line 50 in FIG. 3. The arc is identical for all first order address pairs. In other words, the second order look-up table contains exact LN fraction values that correspond to the FP mantissa as represented by the value of the second order look-up bits. There is also a SLOPE' value for each second order address that represents the rate of change between two adjacent SEED' values. Given an address as represented by the second order look-up bits 210, the second order look-up table 230 outputs the SEED' to an adder 234. The look-up table outputs the SLOPE' to the second order interpolator 232.

The second order interpolator 232 is connected to the second order interpolator bits 212. The value of the interpolator bits is multiplied with the SLOPE' value from the second order look-up table 230 to compute a result that represents the second order interpolation of the corresponding LN fraction value. The output of the interpolator is connected to an adder 234.

As stated earlier, though the arc between two first order look-up values is constant throughout all first order look-up address pairs, the curvature, or the height of the arc varies from each first order look-up value to the next. To compensate for the change in curvature, the curvature value, or CURVATURE, for each first order look-up value is used to adjust the second order interpolation of the arc function. A multiplier 236 is connected to an adder 234, where the resulting LN fraction of the second order arc interpolation is combined. This result is multiplied with the CURVATURE and a properly scaled arc interpolation value is achieved. The result from the first order interpolation is combined with the second order arc interpolation via adder 238. The output of adder 238 is combined with the SEED from the first look-up address in adder 226. The output of adder 226 is the LN fraction for the given input mantissa in register 202. The output of the adder connects to the fraction 244 of the register 240. The converted LN value is stored in register 240.

The accuracy of the second order interpolation is shown as follows. Referring again to FIG. 5, it is observed that for any two adjacent address values, the change in curvature of the logarithmic function from one address to the next will be small. In particular, this is true for a large look-up table where the difference in curvature from one address to another converges to a small value. Furthermore, if the curvature is normalized then the error between the first order interpolation function and the true logarithmic function would be constant in the form of an arc over any range of first order addresses. The arc is a small segment of the logarithmic function that spans any two first order look-up addresses. Therefore, the curvature can be used as a scaling factor for the arc, where the arc is used as the second order correction for the first order linear interpolated value. In addition, since the effect of the curvature is constant between two first order look-up addresses, the value of the curvature can be stored along with the first order SEED values as addressed by the first order look-up addresses. For any second order look-up address, the arc is pre-determined as a function over the range of the second order addresses and is stored in the second order look-up table.

After the numbers in the floating point format are converted to their logarithmic equivalents, an ALU performs the desired arithmetic operations in the logarithmic domain. The table below illustrates the arithmetic operation in the linear domain and the corresponding operation in the logarithmic domain.

TABLE 2

| Operation | Linear domain | Logarithmic domain |
|---|---|---|
| Multiply | A * B | log(A*B) = log(A) + log(B) |
| Divide | A / B | log(A/B) = log(A) − log(B) |
| square root | $A^{\frac{1}{2}}$ | log($A^{\frac{1}{2}}$) = log(A) >> 1 (shift) |
| exponent | $A^N$ | log($A^N$) = N * log(A) |

Figure 7:
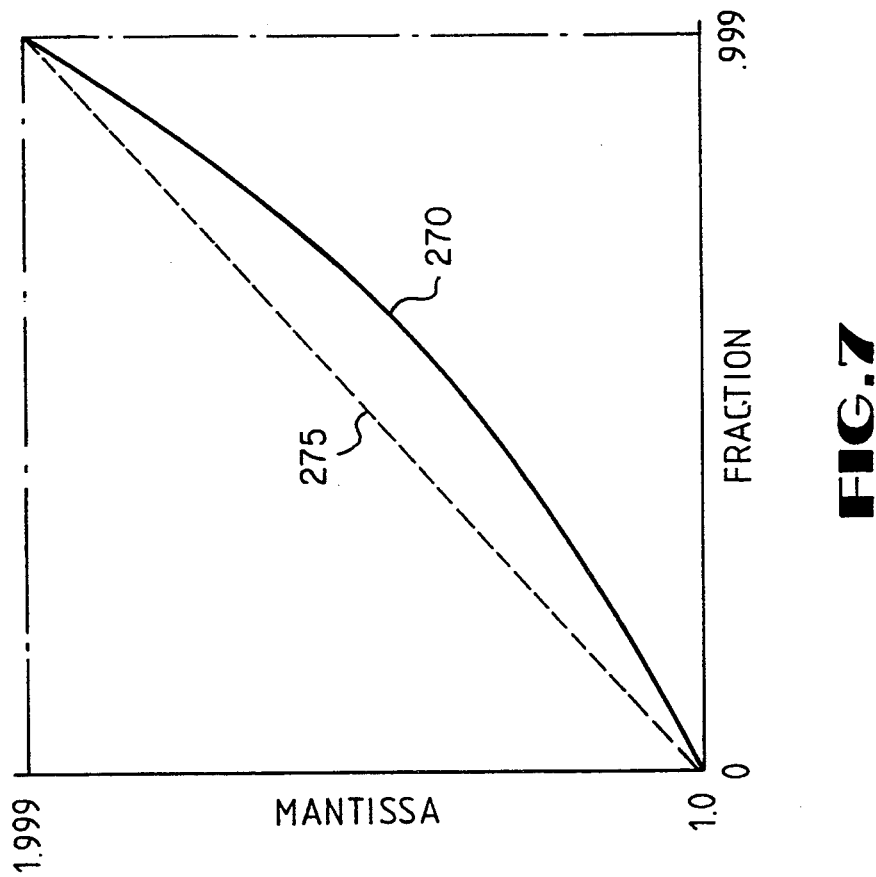
FIG. 7 illustrates the inverse logarithmic relationship of the mantissa as a function of the fraction.

Once the result of the arithmetic operation is computed, the logarithmic result must be converted to its floating point equivalent. This inverse transformation is performed by applying a similar but inverted logarithmic technique. FIG. 7 shows a graph of the inverse logarithmic function. Referring to FIG. 7, it is illustrated that a curve 270 of an exponential curve in base 2 is used to convert the LN fraction back to the desired FP mantissa.

Figure 8:
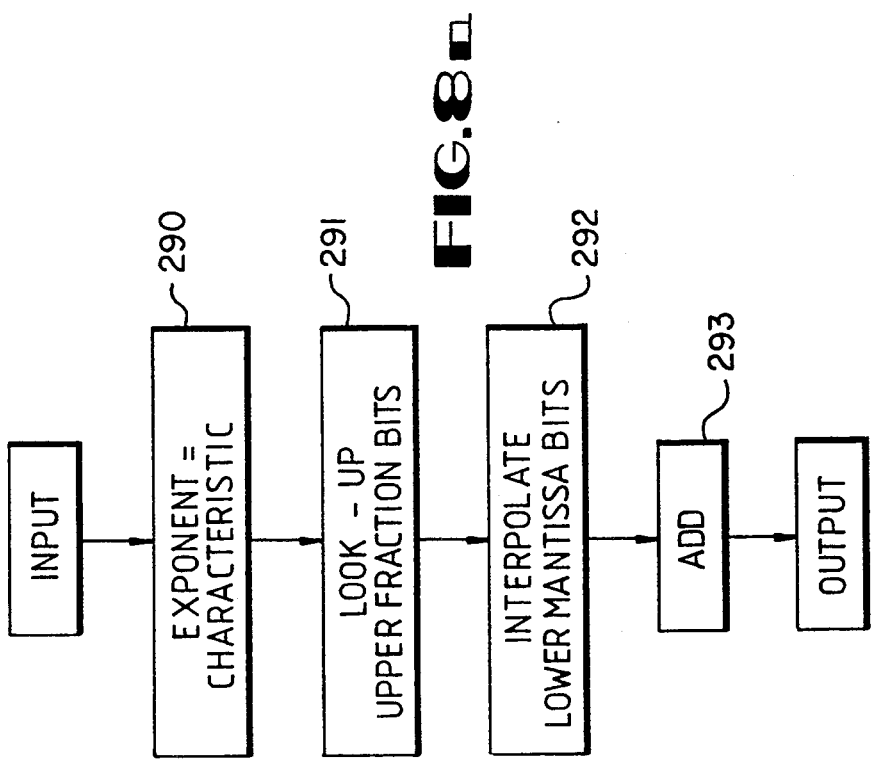
FIG. 8(a) is a flow chart of a first-order interpolation for inverse conversion, according to the method of the present invention.
FIG. 8(b) is a block diagram of a first-order inverse converter built according to the present invention.
FIG. 8(c) is a flow chart of a second-order inverse interpolation according to the method of the present invention.
FIG. 8(d) is a block diagram of a second-order inverse converter built according to the present invention.

FIG. 8(a) is a flow chart of the LN to FN conversion method of the preferred embodiment of the invention. In step 290, the LN characteristic is used as the FP exponent. In step 291, the upper order bits of the LN fraction are used as an address into a look-up table. The address in the look-up table contains the exact FN mantissa value corresponding to the address. In step 292, the lower order bits of the LN fraction are interpolated to compute its corresponding FP value. In step 293, the FP values of the upper and lower order bits of the fraction are added to determine the FP mantissa.

Figure 8C:
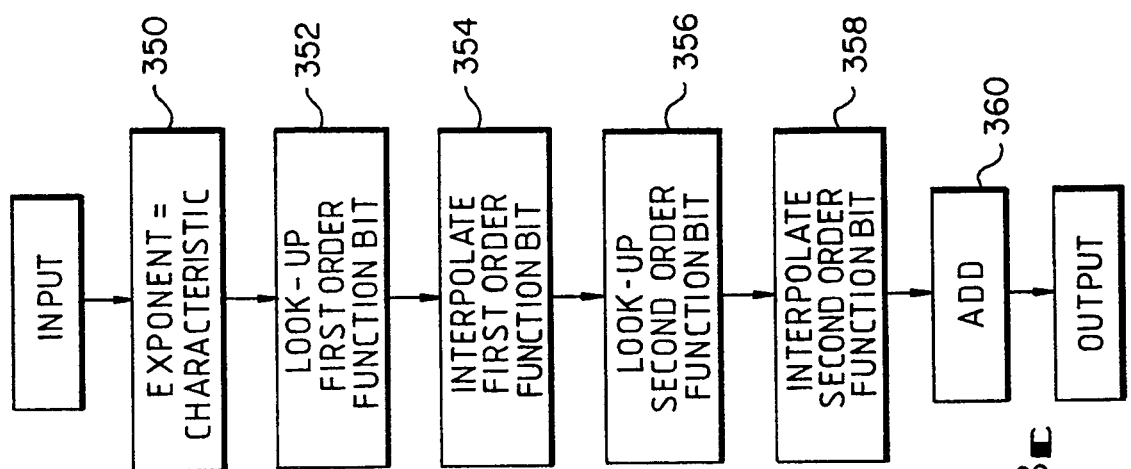
Figure 8B:
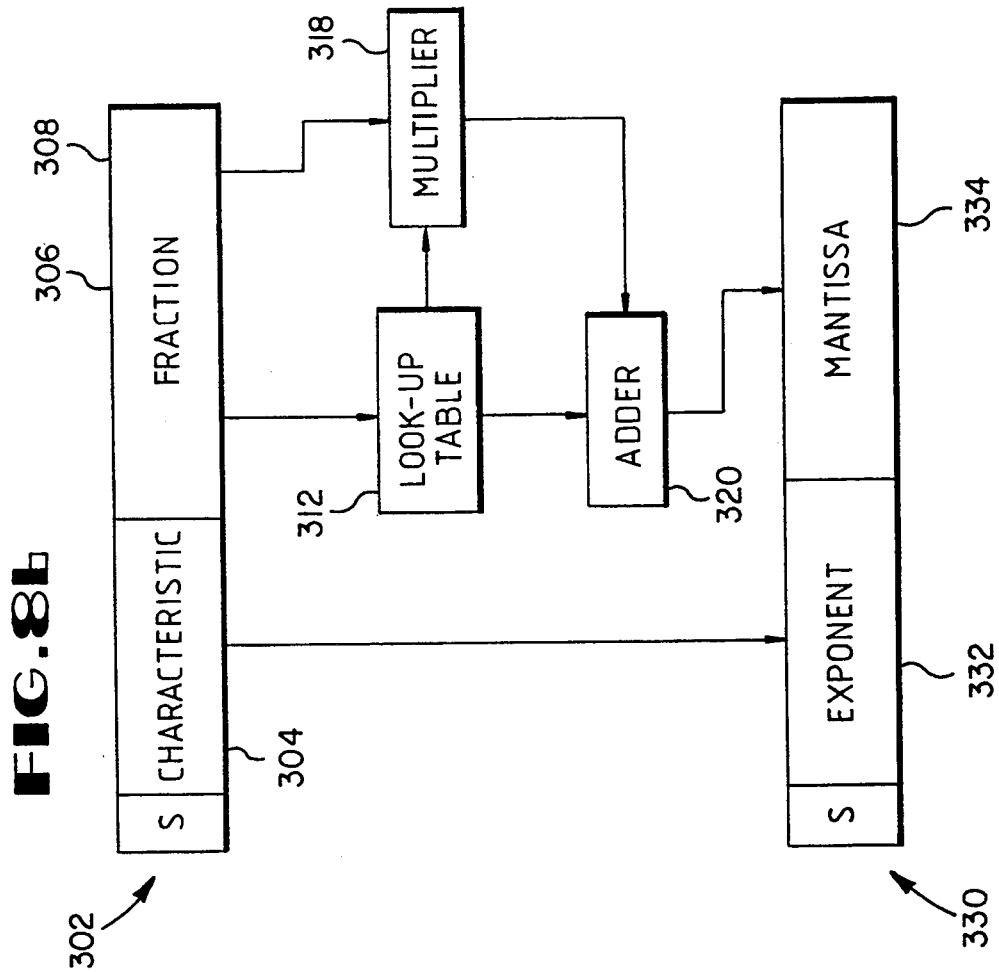

FIG. 8(b) is a block diagram which illustrates the LN to FP converter 300 of the preferred embodiment of the invention. A register 302 containing a logarithmic number having a characteristic 304 concatenated with a fraction 306, comprising of upper order look-up bits 306 and lower order interpolation bits 308. The conversion of a number in the logarithmic representation to its corresponding floating point representation begins by equating the LN characteristic 304 as the value representing the FP exponent 332 of the FP value stored in register 330.

Next, the FP mantissa 334 is computed by the use of a look-up table 312 and an interpolator 318. The look-up table is connected to the upper look-up bit 306. The look-up table is also connected to the interpolator 318 and an adder 320. The upper look-up bits are used as an input address to the look-up table. The address in the look-up table contains a value called ∼SEED, which is the exact FP mantissa for the value represented by the upper look-up bits of the fraction. The look-up table also has a value of ∼SLOPE, which is the rate of change between two adjacent ∼SEEDs, for every address. Given an input address from the upper look-up bits, the look-up table outputs the ∼SEED to the adder 320 and also outputs the ∼SLOPE to the input of the interpolator 318.

The interpolator 318 is connected to the lower order bits of the fraction, or the lower interpolation bits 308. The interpolator is also connected to the look-up table and the adder. The value of the lower interpolation bits is input into the interpolator and multiplied with the value of ∼SLOPE from the look-up table to compute the interpolated FP mantissa corresponding the value of fraction as represented by the lower interpolation bits. The resulting interpolated FP value is combined with the look-up ∼SEED value by the adder 320 and becomes the FP mantissa 334 and is stored with the exponent in register 330.

FIG. 8(c) is a flow chart depicting an LN to FP conversion using a second order interpolation method of the preferred embodiment of the invention. In step 350, a characteristic of the input LN operand is used as the exponent of the output FP value. The LN fraction is divided into four parts: first order look-up bits, second order look-up bits, first order interpolation bits, and second order interpolation bits. In step 352, the first order look-up bits are used as an address into a first order look-up table. The address in the look-up table contains the exact FP value corresponding to the address. In step 354, the first order interpolation bits are interpolated linearly to compute the corresponding FP value. In step 356, the second order address bits are used as an address into a second order look-up table. In step 358, the output from the second order look-up table is combined with the second order interpolation bits to better interpolate the true logarithmic function and achieve greater accuracy. In step 360, the LN values from all the above steps are added to determine the resulting LN fraction value.

Figure 8D:
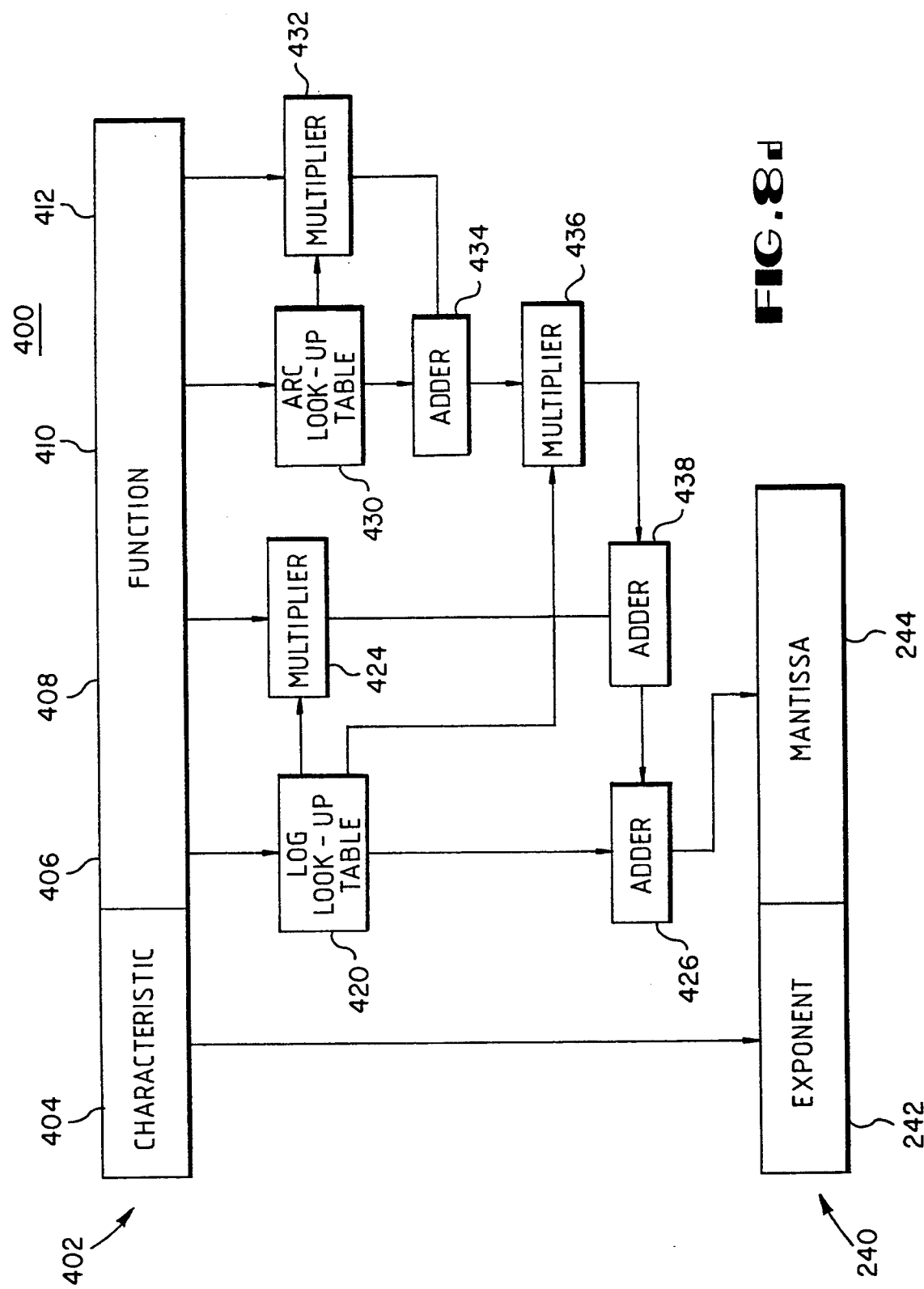

FIG. 8(d) is a block diagram of the second order LN to FP converter 400 of the preferred embodiment off the invention. In general, a first order look-up table 420 and an interpolator 424 are first used to compute a first order linear interpolation between two adjacent look-up values. To increase accuracy over the first order interpolation method, the difference between the straight line interpolation function and the true logarithmic function must be computed in order to produce a more accurate resulting logarithmic value. Therefore, a second order look-up table 430 and a second order interpolator 432 are used to increase the accuracy for determining the arc interpolation between two adjacent look-up values.

In particular, a register 402 contains a number in the 32 bit LN number format. The LN number is represented by a sign bit, a 8 bit characteristic, and a 23 bit fraction. The LN characteristic 404 connects to a FP exponent 442 and is used as the value of the exponent of the converted FP. The LN fraction is divided into four parts: first order look-up bits of 7 bits 406, first order interpolation bits of 16 bits 408, second order look-up bits of 7 bits 410, and second order interpolation bits of 9 bits 412.

A first order look-up table 420 is connected to the first order look-up bits 406. The first order look-up bits are used as an address in the look-up table. For each address, there is a ∼SEED value representing the exact FP mantissa for the value of the first order look-up bits. There is also a ∼SLOPE value for each address that represents the rate of change between two adjacent ∼SEEDs. There is also a ∼CURVATURE value that represents the rate of change between two adjacent ~SLOPE values. Given an address as represented by the first order look-up bits 406, the look-up table 420 outputs the ~SEED to an adder 426. The look-up table outputs the ~SLOPE to the first order interpolator 424. The look-up table outputs a ~CURVATURE to a multiplier 436.

The first order interpolator 424 is connected to the first order interpolator bits 408. The value of the interpolator bits is multiplied with the ~SLOPE value from the first order look-up table 420 to compute a result that represents the first order linear interpolation of the corresponding FP mantissa value. The output of the interpolator is connected to an adder 438.

To achieve additional accuracy from the first order interpolation, a second order look-up table 430 is connected to the second order look-up bits 410. The second order look-up bits are used as an address in the second order look-up table. For each address, there is a corresponding ~SEED', a second order ~SEED value, representing a point on an arc spanning between two ~SEED values, i.e., two first order look-up values. The arc is a small section of the logarithmic function as illustrated by line 50 in FIG. 3. The arc is identical for all first order address pairs. In other words, the second order look-up table contains exact FP mantissa values that correspond to the LN fraction as represented by the value of the second order look-up bits. There is also a ~SLOPE' value for each second order address that represents the rate of change between two adjacent ~SEED' values. Given an address as represented by the second order look-up bits 410, the second order look-up table 430 outputs the ~SEED' to an adder 434. The look-up table outputs the ~SLOPE' to the second order interpolator 432.

The second order interpolator 432 is connected to the second order interpolator bits 412. The value of the interpolator bits is multiplied with the ~SLOPE' value from the second order look-up table 430 to compute a result that represents the second order interpolation of the corresponding FP mantissa value. The output of the interpolator is connected to an adder 434.

As stated earlier, though the arc between two first order look-up values is constant throughout all first order look-up address pairs, the curvature, or the height of the arc varies from each first order look-up value to the next. To compensate for the change in curvature, a curvature value, or ~CURVATURE, for each first order look-up value is used to adjust the second order interpolation of the arc function. A multiplier 436 is connected to an adder 434, where the resulting FP mantissa of the second order arc interpolation is combined. This result is multiplied with the ~CURVATURE and a properly scaled arc interpolation value is achieved. The result from the first order interpolation is combined with the second order arc interpolation via adder 438. The output of adder 438 is combined with the ~SEED from the first look-up address in adder 426. The output of adder 426 is the FP mantissa for the given input LN fraction in register 402. The output of the adder connects to the mantissa 444 of the register 440. The converted FP value is stored in register 440.

FIG. 9 is a flow chart depicting the process of the preferred embodiment of the present invention. In step 500, an X operand is converted from FP to LN. In step 502, a Y operand is converted from FP to LN. Steps 500 and 502 may take place simultaneously, or either one may take place before the other. In step 504 the ALU operates on the logarithmic representations of the X and Y operands. As is commonly known and illustrated in the above TABLE 2, addition and subtraction of logarithmic values is the same as multiplication and division of the actual numbers represented by the logarithmic values. In step 506 a barrel shift is performed on any logarithmic representation of the X and Y operands as is desired in order to perform exponentiation. In step 508 the logarithmic value of the function which uses the X and Y operands is converted back to FP, thus generating the result, which is a number in floating point format.

In the preferred embodiment of the invention, the converter, according to the present invention, is incorporated in a computing unit, e.g., a DSP. Referring now to FIG. 10, a converter 602 is implemented in a system architecture 600 of either the Texas Instruments TMS320C3 (C30) or the TMS320C40 (C40) or comparable DSPs. The input of the converter is connected to the output of a shifter/ALU 604. The output of the converter is connected to the input of a group of extended precision registers 606. The converter performs either the FP to LN conversion or the LN to FP conversion on the input operands. The converter is implemented as a ROM look-up table with control signals for selecting the desired conversion, namely FP to LN or LN to FP. The DSP architecture 600 allows operands to circulate about the various sub-components. These sub-components, e.g., a multiplier 608 and a shifter/ALU 604, will perform a arithmetic operation on the operands depending on the selection of the desired arithmetic operation. For example, initially, the FP input operands, loaded in REG1 610 and REG2 612 are passed directly through the shifter/ALU 604 and into the converter 602 for conversion from FP to LN. Next, the converted operands, in LN format, are passed through the extended precision registers 606 to REG1 610 and REG2 612. Depending on the desired arithmetic operation, LN operands in REG1 and REG2 are send either to the multiplier 608 or the shifter/ALU 604. Once the arithmetic operation has been performed, the result is input into the converter 602 for conversion from LN to FP representation. This implementation minimizes the hardware requirement on the C30 or C40 architecture, but requires several circular passes to perform the desired arithmetic operation.

Figure 11:
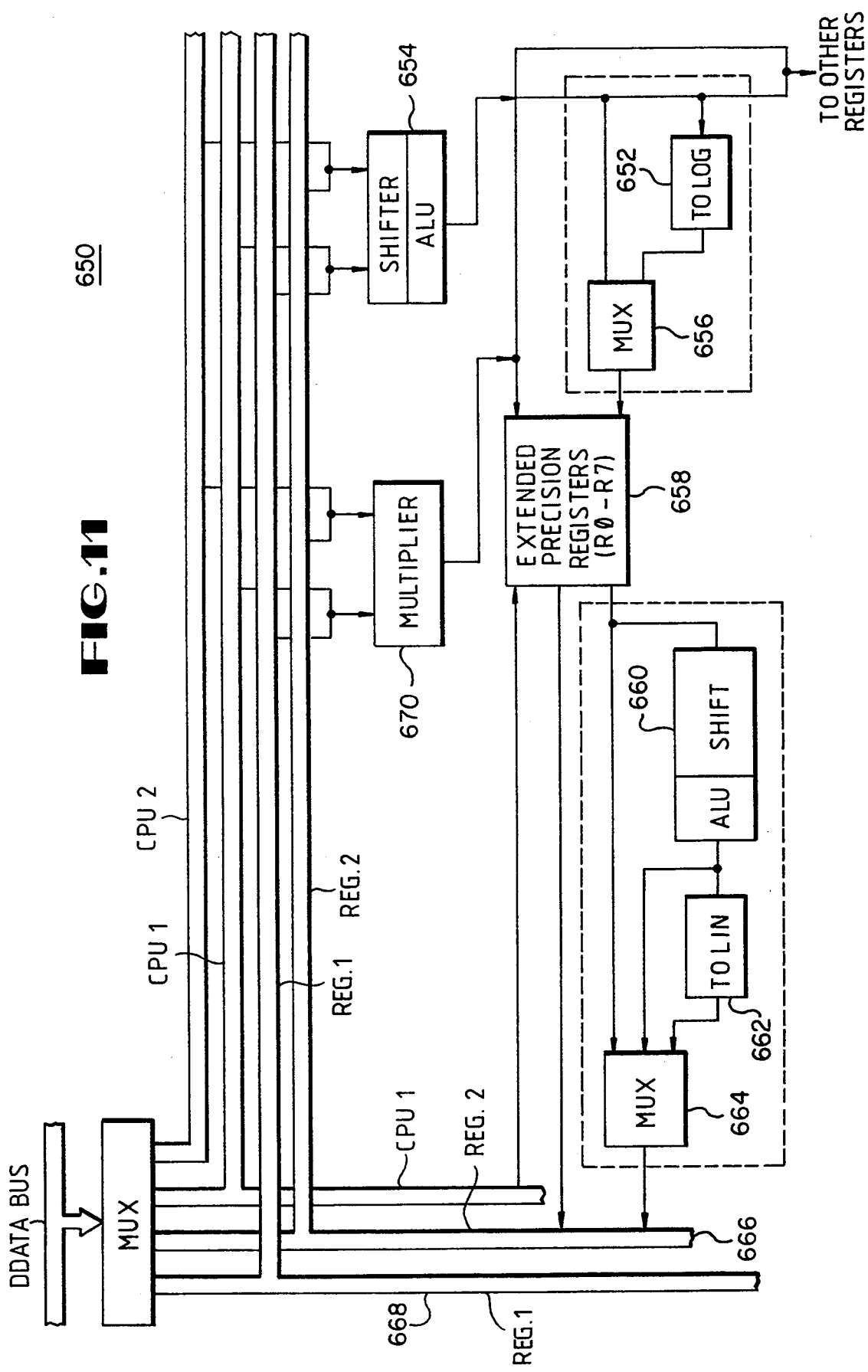

Referring now to FIG. 11, another implementation is disclosed. This implementation enables the desired arithmetic operation to be performed in a single pass through a C30 or C40, or a comparable DSP. Two converters are used for this implementation. In a system 650, a FP to LN converter 652 is implemented as a ROM look-up table. The converter input connects to the output of a shifter/ALU 654. The converter output connects to a MUX 656 which is connected to a group of extended precision registers 658. The converter converts input FP operands to LN equivalents and outputs the LN operands to the extended precision registers 658. The output of the extended precision registers is connected to a shifter/ALU 660. The shifter/ALU performs the desired arithmetic operation on the LN operands. The result of the arithmetic operation is output to a second converter 662. The second converter is also implemented as a ROM look-up table for performing LN to FP conversion. The input of the second converter 662 is connected to the output of the shifter/ALU 660. The output of the second converter is connected to a MUX 664, which is connected to a REG2 666. The result of the desired arithmetic operation is represented in FP format and stored in REG2. This implementation requires more hardware sub-components in the C30 or C40, but allows FP arithmetic operation to be performed in a single pass.

Building the ALU into a C30 or C40 type architecture also has another advantage in that the conversion process can utilize the pipeline architecture. In the case of the C30 and C40, the pipeline is four deep with fetch, decode, read and execute phases thus insuring that the speed of this implementation would not be sacrificed. Referring now to FIG. 12, a single converter 702 is implemented in a DSP architecture of a system 700. The converter performs either the FP to LN or the LN to FP conversion, depending on the desired operation. The converter can process only one input operand at a time, therefore, several passes are required to perform the desired arithmetic operation. The converter input is connected to a data bus 704. The converter output connects to a time delay component 706 that connects to an ALU 708. The delay component enables the converter to convert a second input operand while the first converted operand waits for one timing cycle in the delay component. Next, both operands are input into an ALU 708 to be processed. The ALU output is connected to a accumulator 710 which is connected to a barrel shifter 712. The barrel shifter can perform the desired arithmetic operation on the operand and output to the data bus 704 for a second pass through the converter. On the second pass, the resulting operand is converted from LN to FP and the result is stored in the accumulator 710. The advantage of the pipeline is that minimization of hardware can be implemented without undue delay in processing time.

Additionally, there are three advantages in the use of this converter for ALU performing floating point operations. In particular this implementation allows single cycle instructions with a more diverse instruction mix all with a somewhat simplified compiler structure. The advantages of this invention are obvious in an application where any mathematic non-primitives are called as a function. Currently, with non-floating point ALUs, the problem with called functions is that they require extra cycles to set up, execute and return. For example, to compute the magnitude of a complex number, a current technology high-speed DSP requires approximately 40 computing cycles to complete a square root function. The present invention can perform the same operation in one computing cycle. Clearly, this invention represents a 40 to 1 improvement in speed.

There are other indirect benefits which may also be of use. One in particular is the calculation of sines and cosines. On the C30 this would normally require that the angle be restricted to ±pi/2 radian. This would require at least one division followed by a MacLauren power series expansion. In the case of the MacLauren series, it converges best when the input is close to zero. It would be advantageous if the angle were restricted to pi/4 instead of pi/2, but this would require a square root. With an ALU incorporating the present invention, division, square root, and MacLauren power series would no longer be a restriction.

Another benefit of this invention is smaller code size. For functions implemented in the ALU such as divide there is a fixed decrease in code size from the elimination of a subroutine. Additionally the overhead required to call the function is eliminated. Another related benefit is that the compiler needed to parse out and generate optimized code would also be far simpler.

What is claimed is:

1. A method for converting an n-bit floating point number to a logarithmic representation with a digital processor, the number having a first set of bits assigned to a mantissa, and a second set of bits assigned to an exponent, the logarithmic representation having a characteristic and a fraction, comprising the steps of:
   a. setting the characteristic of the logarithm equal to the second set of bits;
   b. selecting from a logarithm table a first logarithm of a first subset of the first set;
   c. selecting from the logarithm table a slope of a logarithmic function at the first logarithm;
   d. multiplying the slope times a second subset of the first set with a multiplier to obtain an interpolated value;
   e. adding the interpolated value to the first logarithm with an adder to obtain the fraction; and
   f. adding the characteristic and the fraction to obtain the logarithmic representation.

2. A method for converting an n-bit floating point number to a logarithmic representation with a digital processor, the number having a first set of bits assigned to a mantissa, and a second set of bits assigned to an exponent, the logarithmic representation having a characteristic and a fraction, comprising the steps of:
   a. setting the characteristic of the logarithm equal to the second set of bits;
   b. selecting from a logarithm table a first logarithm of a first subset of the first set;
   c. calculating a slope of a logarithmic function at the first logarithm, comprising the steps of:
      i. selecting from the logarithm table a value adjacent to the first logarithm; and
      ii. calculating the difference between the value and the first logarithm;
   d. multiplying the slope times a second subset of the first set with a multiplier to obtain an interpolated value;
   e. adding the interpolated value to the first logarithm with an adder to obtain the fraction; and
   f. adding the characteristic and the fraction to obtain the logarithmic representation.

3. The method of either claims 1 or 2 wherein the number of entries in the logarithm table is equal to the number 2 raised to the power of the number of bits contained in the first subset.

4. The method of either claims 1 or 2 wherein the logarithm table is stored in a ROM.

5. The method of claim 2 wherein the value selected is greater than the first logarithm.

6. A method for converting an n-bit floating point number to a logarithmic representation with a digital processor, the number having a first set of bits assigned to a mantissa, and a second set of bits assigned to an exponent, the logarithmic representation having a characteristic and a fraction, comprising the steps of:
   a. setting the characteristic equal to the second set of bits;
   b. selecting from a first look-up table a first logarithm of a third subset of the first set:
   c. selecting from the first look-up table a first slope of a first logarithmic function at the first logarithm;
   d. selecting from the first look-up table a curvature of the first logarithmic function at the first logarithm;
   e. multiplying the first slope times a sum of a fourth and fifth subset of the first set with a multiplier to obtain a first interpolation;

f. selecting from a second look-up table a seed as a function of a second logarithm of a fourth subset of the first set;
g. selecting from the second look-up table a second slope of a second logarithmic function at the second logarithm;
h. multiplying the second slope times a fifth subset of the first set to obtain a second interpolation;
i. adding the second interpolation to the seed with an adder to obtain an arc;
j. multiplying the arc by the curvature to obtain a scaled arc;
k. adding the first interpolation and the scaled arc to the first logarithm to obtain the fraction; and
l. adding the characteristic and the fraction to obtain the logarithmic representation.

7. A method for converting an n-bit floating point number to a logarithmic representation with a digital processor, the number having a first set of bits assigned to a mantissa, and a second set of bits assigned to an exponent, the logarithmic representation having a characteristic and a fraction, comprising the steps of:
a. setting the characteristic equal to the second set of bits;
b. selecting from a first look-up table a first logarithm of a third subset of the first set;
c. calculating a first slope of a first logarithmic function at the first logarithm, comprising the steps of:
 i. selecting from the first look-up table a value adjacent to the first logarithm; and
 ii. calculating the difference between the value and the first logarithm;
d. selecting from the first look-up table a curvature of the first logarithmic function at the first logarithm;
e. multiplying the first slope times a sum of a fourth and fifth subset of the first set with a multiplier to obtain a first interpolation;
f. selecting from a second look-up table a seed as a function of a second logarithm of a fourth subset of the first set;
g. selecting from the second look-up table a second slope of a second logarithmic function at the second logarithm;
h. multiplying the second slope times a fifth subset of the first set to obtain a second interpolation;
i. adding the second interpolation to the seed with an adder to obtain an arc;
j. multiplying the arc by the curvature to obtain a scaled arc;
k. adding the first interpolation and the scaled arc to the first logarithm to obtain the fraction; and
l. adding the characteristic and the fraction to obtain the logarithmic representation.

8. A method for converting an n-bit floating point number to a logarithmic representation with a digital processor, the number having a first set of bits assigned to a mantissa, and a second set of bits assigned to an exponent, the logarithmic representation having a characteristic and a fraction, comprising the steps of:
a. setting the characteristic equal to the second set of bits;
b. selecting from a first look-up table a first logarithm of a third subset of the first set;
c. selecting from the first look-up table a first slope of a first logarithmic function at the first logarithm;
d. selecting from the first look-up table a curvature of the first logarithmic function at the first logarithm;
e. multiplying the first slope times a sum of a fourth and fifth subset of the first set with a multiplier to obtain a first interpolation;
f. selecting from a second look-up table a seed as a function of a second logarithm of a fourth subset of the first set;
g. calculating a second slope of a second logarithmic function at the second logarithm, comprising the steps of:
 i. selecting from the second look-up table a value adjacent to the second logarithm; and
 ii. calculating the difference between the value and the second logarithm;
h. multiplying the second slope times a fifth subset of the first set to obtain a second interpolation;
i. adding the second interpolation to the seed with an adder to obtain an arc;
j. multiplying the arc by the curvature to obtain a scaled arc;
k. adding the first interpolation and the scaled arc to the first logarithm to obtain the fraction; and
l. adding the characteristic and the fraction to obtain the logarithmic representation.

9. A method for converting an n-bit floating point number to a logarithmic representation with a digital processor, the number having a first set of bits assigned to a mantissa, and a second set of bits assigned to an exponent, the logarithmic representation having a characteristic and a fraction, comprising the steps of:
a. setting the characteristic equal to the second set of bits;
b. selecting from a first look-up table a first logarithm of a third subset of the first set;
c. selecting from the first look-up table a first slope of a first logarithmic function at the first logarithm;
d. calculating a second-order derivative of the first logarithm, to obtain a curvature of the first logarithmic function at the first logarithm;
e. multiplying the first slope times a sum of a fourth and fifth subset of the first set to obtain a first interpolation;
f. selecting from a second look-up table a seed as a function of a second logarithm of a fourth subset of the first set;
g. selecting from the second look-up table a second slope of a second logarithmic function at the second logarithm;
h. multiplying the second slope times a fifth subset of the first set to obtain a second interpolation;
i. adding the second interpolation to the seed to obtain an arc;
j. multiplying the arc by the curvature to obtain a scaled arc;
k. adding the first interpolation and the scaled arc to the first logarithm to obtain the fraction; and
l. adding the characteristic and the fraction to obtain the logarithmic representation.

10. A method for converting an n-bit floating point number to a logarithmic representation with a digital processor, the number having a first set of bits assigned to a mantissa, and a second set of bits assigned to an exponent, the logarithmic representation having a characteristic and a fraction, comprising the steps of:
a. setting the characteristic equal to the second set of bits;
b. selecting from a first look-up table a first logarithm of a third subset of the first set;

c. calculating a first slope of a first logarithmic function at the first logarithm, comprising the steps of:
  i. selecting from the first look-up table a first value adjacent to the first logarithm; and
  ii. calculating the difference between the first value and the first logarithm;
d. calculating a curvature of the first logarithmic function at the first logarithm, comprising the steps of:
  i. selecting from the first look-up table a second value, wherein the second value is adjacent the first value, and is not the first logarithm;
  ii. calculating the difference between the first value and the second value to obtain a second slope of the first logarithmic function at the first value; and
  iii. calculating the difference between the first slope and the second slope;
e. multiplying the first slope times a sum of a fourth and fifth subset of the first set to obtain a first interpolation;
f. selecting from a second look-up table a seed as a function of a second logarithm of a fourth subset of the first set;
g. selecting from the second look-up table a third slope of a second logarithmic function at the second logarithm;
h. multiplying the third slope times a fifth subset of the first set to obtain a second interpolation;
i. adding the second interpolation to the seed to obtain an arc;
j. multiplying the arc by the curvature to obtain a scaled arc;
k. adding the first interpolation and the scaled arc to the first logarithm to obtain the fraction; and
l. adding the characteristic and the fraction to obtain the logarithmic representation.

11. A method for converting an n-bit floating point number to a logarithmic representation with a digital processor, the number having a first set of bits assigned to a mantissa, and a second set of bits assigned to an exponent, the logarithmic representation having a characteristic and a fraction, comprising the steps of:
a. setting the characteristic equal to the second set of bits;
b. selecting from a first look-up table a first logarithm of a third subset of the first set;
c. selecting from the first look-up table a first slope of a first logarithmic function at the first logarithm;
d. selecting from the first look-up table a curvature of the first logarithmic function at the first logarithm;
e. multiplying the first slope times a sum of a fourth and fifth subset of the first set to obtain a first interpolation;
f. selecting from a second look-up table a seed as a function of a second logarithm of a fourth subset of the first set;
g. selecting from the second look-up table a second slope of a second logarithmic function at the second logarithm;
h. multiplying the second slope times a fifth subset of the first set to obtain a second interpolation;
i. adding the second interpolation to the seed to obtain an arc;
j. multiplying the arc by the curvature to obtain a scaled arc;
k. adding the first interpolation and the scaled arc to the first logarithm to obtain the fraction; and
l. adding the characteristic and the fraction to obtain the logarithmic representation.

12. The method of claim 11 wherein the second look-up table has a number of entries equal to the number 2 raised to the power of the number of bits in the fourth subset.

13. The method of any of claims 6–12 wherein the look-up tables are stored in ROMs.

14. The method of any of claims 6–12 wherein seeds in the second look-up table are generated by the following steps:
a. calculating logarithmic values for the fourth subset;
b. calculating points on a straight line between the first and last logarithmic values of the fourth subset; and
c. generating the seeds by calculating the differences between the logarithmic values and the points.

15. The method of any of claims 6–12 wherein seeds in the second look-up table are generated by the following equation:

$$\text{SEED} = \sqrt{R^2 - (X + K)^2}$$

where:
R is the radius of curvature as bounded by the curvature of the logarithm of the mantissa for values between 1 and 2;
X is the range encompassed by the number 2 raised to the power of the number of bits in the fourth subset; and
K is a constant added to the fourth subset so that first and last inputs into the second look-up table from the fourth subset are equal to zero, wherein the first input is all bits of the fourth subset equal to zero, and the last input is all bits of the fourth subset equal to one.

16. The method of any of claims 6–12 wherein seeds in the second look-up table are generated by the following equation:

$$\text{SEED} = \sqrt{R^2 - (X + K)^2}$$

where:
R is the radius of curvature as bounded by the curvature of the logarithm of the mantissa for values between 1 and 2;
X is the range encompassed by the number 2 raised to the power of the number of bits in the fourth subset; and
K is a constant added to the fourth subset so that the greatest seed is at the midpoint of first and last inputs into the second look-up table, wherein the first input is all bits of the fourth subset equal to zero, and the last input is all bits of the fourth subset equal to one.

17. The method of claim 16 wherein only half of the seeds are stored in the second look-up table.

18. An apparatus for converting an n-bit floating point number to a logarithmic representation, the number having a first set of bits assigned to a mantissa, and a second set of bits assigned to an exponent, the logarithmic representation having a characteristic and a fraction, comprising:
a. a first register for storing the number;
b. a converter coupled to the first register, the converter responsive to a third subset of the first set for generating a first logarithm of a third subset of the first set and for generating a slope of a logarithmic function at the first logarithm;
c. a multiplier coupled to the converter and coupled to the first register, the multiplier responsive to a sum of a fourth and fifth subset of the first set and responsive to the slope for generating an interpolated value;
d. an adder coupled to the converter and coupled to the multiplier, the adder responsive to the interpolated value and responsive to the first logarithm for generating the fraction; and
e. a second register coupled to the first register and coupled to the adder, for receiving the second set of bits in a first part and for receiving the fraction in a second part, wherein the logarithmic representation is a combination of the first and second parts.

19. The apparatus of claim 18 wherein the converter comprises a logarithm look-up table stored in a ROM.

20. An apparatus for converting an n-bit floating point number to a logarithmic representation, the number having a first set of bits assigned to a mantissa, and a second set of bits assigned to an exponent, the logarithmic representation having a characteristic and a fraction, comprising:
a. a first register for storing the number;
b. a first converter responsive to a third subset of the first set for generating a first logarithm of a third subset of the first set, for generating a first slope of a logarithmic function at the first logarithm, and for generating a curvature of the first logarithmic function at the first logarithm;
c. a first multiplier responsive to a sum of a fourth and fifth subset of the first set and responsive to the slope for generating a first interpolation;
d. a second converter responsive to a fourth subset of the first set for generating a seed as a function of a second logarithm of a fourth subset of the first set, and for generating a second slope of a second logarithmic function at the second logarithm;
e. a second multiplier responsive to the second slope and to a fifth subset of the first set for generating a second interpolation;
f. a first adder responsive to the second interpolation and to the seed for generating an arc;
g. a third multiplier responsive to the arc and to the curvature for generating a scaled arc;
h. a second adder responsive to the first interpolation and to the scaled arc and to the first logarithm for generating the fraction; and
i. a second register for receiving the second set of bits in a first part and for receiving the fraction in a second part, wherein the logarithmic representation is a combination of the first and second parts.

21. The apparatus of claim 20 wherein the converters comprise logarithm look-up tables stored in ROMs.

22. A system having a high speed digital computation system, the digital computation system comprising an apparatus for converting an n-bit floating point number to a logarithmic representation, the number having a first set of bits assigned to a mantissa, and a second set of bits assigned to an exponent, the logarithmic representation having a characteristic and a fraction, comprising:
a. a first register for storing the number;
b. a converter coupled to the first register, the converter responsive to a third subset of the first set for generating a first logarithm of a third subset of the first set and for generating a slope of a logarithmic function at the first logarithm;
c. a multiplier coupled to the converter and coupled to the first register, the multiplier responsive to a sum of a fourth and fifth subset of the first set and responsive to the slope for generating an interpolated value;
d. an adder coupled to the converter and coupled to the multiplier, the adder responsive to the interpolated value and responsive to the first logarithm for generating the fraction; and
e. a second register coupled to the first register and coupled to the adder, for receiving the second set of bits in a first part and for receiving the fraction in a second part, wherein the logarithmic representation is a combination of the first and second parts.

23. The system of claim 22 wherein the converter comprises a logarithm look-up table stored in a ROM.

24. A system having a high speed digital computation system, the digital computation system comprising an apparatus for converting an n-bit floating point number to a logarithmic representation, the number having a first set of bits assigned to a mantissa, and a second set of bits assigned to an exponent, the logarithmic representation having a characteristic and a fraction, comprising:
a. a first register for storing the number;
b. a first converter responsive to a third subset of the first set for generating a first logarithm of a third subset of the first set, for generating a first slope of a logarithmic function at the first logarithm, and for generating a curvature of the first logarithmic function at the first logarithm;
c. a first multiplier responsive to a sum of a fourth and fifth subset of the first set and responsive to the slope for generating a first interpolation;
d. a second converter responsive to a fourth subset of the first set for generating a seed as a function of a second logarithm of a fourth subset of the first set, and for generating a second slope of a second logarithmic function at the second logarithm;
e. a second multiplier responsive to the second slope and to a fifth subset of the first set for generating a second interpolation;
f. a first adder responsive to the second interpolation and to the seed for generating an arc;
g. a third multiplier responsive to the arc and to the curvature for generating a scaled arc;
h. a second adder responsive to the first interpolation and to the scaled arc and to the first logarithm for generating the fraction; and
i. a second register for receiving the second set of bits in a first part and for receiving the fraction in a second part, wherein the logarithmic representation is a combination of the first and second parts.

25. The system of claim 24 wherein the converters comprise logarithm look-up tables stored in ROMs.

26. The apparatus of any of claims 18–25 wherein seeds in the second look-up table are generated by the following steps:
a. calculating logarithmic values for the fourth subset;
b. calculating points on a straight line between the first and last logarithmic values of the fourth subset; and
c. generating the seeds by calculating the differences between the logarithmic values and the points.

* * * * *